Figure 1:
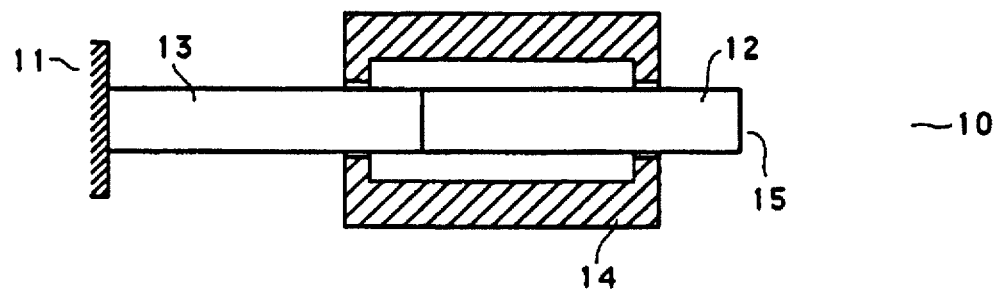

United States Patent [19]
Razzaghi

[11] Patent Number: 5,701,043
[45] Date of Patent: Dec. 23, 1997

[54] HIGH RESOLUTION ACTUATOR

[76] Inventor: Mahmoud Razzaghi, 3740 Boyd Ave. #153, San Diego, Calif. 92111

[21] Appl. No.: 711,176

[22] Filed: Sep. 9, 1996

[51] Int. Cl.$^6$ .................................................. H01L 41/12
[52] U.S. Cl. ................................................ 310/26; 318/118
[58] Field of Search .......................... 310/26, 317, 328; 318/118; 335/215

[56] References Cited

U.S. PATENT DOCUMENTS 4,443,731  4/1984  Butler et al. ............................ 310/334

*Primary Examiner*—Clayton E. LaBalle
*Assistant Examiner*—Judson H. Jones

[57] ABSTRACT

A magnetostrictive material is used to reduce a displacement by a factor of about 1000 to achieve displacements with subnanometer resolution. The range of motion is about 100 μm. In one embodiment, a longitude of a magnetostrictive material is attached end to end to a soft magnetic material of same shape and permeability. A magnet provides a magnetic field of constant intnesity and length along half of the combined longitude. When the magnet is displaced along the combined longitude, the length of the magnetic field inside the magnetostrictive material changes. This change is accompanied by an equal and opposite change in the magnetic material, and therefore, the magnetic circuit remains undisturbed. The result is a linear and hysteresis free change in the expansion or contraction of the magnetostrictive material, and displacement of one of its ends relative to the other. The displacement from the magnetostrictive material is a small fraction of the displacement of the magnet, the fraction being the mount of strain due to the magnetic field in the magnetostrictive material. In another embodiment, a magnetic circuit is closed by a soft magnetic materail between a magnet and a magnetostrictive material. By varying the length of an airgap in the magnetic circuit, the magnetic intensity, and consequently, the amout of expansion of the magnetostrictive material can be changed. This embodiment provides high resolution but with nonlinearity and hysteresis. All embodiments have essentially creep free performance.

13 Claims, 1 Drawing Sheet

HIGH RESOLUTION ACTUATOR

FIELD OF THE INVENTION

This invention relates to small motion devices, actuators, and micrometers in general, and to magnetostrictive actuators and micrometers in particular. Applications include high precision positioning, motion control, and measurement.

BACKGROUND OF THE INVENTION

Devices that provide very small displacements are generally based on the expansion of an electroactive material (piezoelectric or electrostrictive) due to an electric field, or a magnetostrictive material due to a magnetic field. The amount of expansion is controlled by varying the strength of the field in the whole bulk of the material. In open loop configuration, the resolution is limited by the sensitivity and noise of the driver electronics. Major drawbacks of this method are hysteresis and nonlinearity. Electroactive materials also have the additional drawback of creep. For precise motion, a feedback loop is used which adds substantially to the complexity and cost of the system. The closed loop resolution is limited by the sensitivity of the feedback loop and system noise. For resolutions in the range of a few nanometers or smaller, the cost is relatively high. Also, specially for electroactive materials the driver contributes to a major part of the cost.

Some commercially available magnetostrictive materials readily produce strains as high as 0.001 which is about 10 times the strain in electroactive materials. They are also superior to electroactive materials regarding load, creep, sensitivity to temperature, and working temperature range. However, their magnetizing coil generates considerable heat which limits their use to special cases and renders them impractical for most micro positioning systems. Although magnetostrictive materials can perform well at cryogenic temperatures, the coil heat is a major thermal load.

OBJECTIVE

Based on the above considerations, the objectives of the invention include:

1. To provide a simple, cost effective, high resolution actuator which is linear and free of hysteresis and creep, does not necessarily require a closed loop control, and provides repeatable, smooth, and stiction free displacement in the subnanometer to micrometer range with relatively high load capability.

2. To reduce readily achievable displacements by a factor of about 1000 with a simple noncontact leverage mechanism to increase the resolution of ordinary micrometers and actuators by the same factor.

3. To make nanometer displacement a simple and cost effective task.

4. To use magnetostrictive materials in a different way to take full advantage of their infinite resolution and at the same time circumvent their hysteresis and nonlinearity.

5. Achieving objects 1 to 4 by producing a magnetic field of constant intensity with a magnet along a magnetostrictive material in a magnetic circuit through a soft magnetic material, and varying the length of the magnetic field inside the magnetostrictive material through the displacement of the magnet relative to the magnetostrictive material such that the magnetic field which is displaced from the magnetostrictive material shifts into the immediate soft magnetic material, so the total length and the intensity of the magnetic field remains essentially constant in the magnetic circuit.

6. Providing a high resolution, creep free actuator by changing the length of an air gap in a magnetic circuit including a magnet and a magnetostrictive material by moving the magnet or a part of the magnetic circuit that closes the path between the magnet and the magnetostrictive material.

DESCRIPTION OF THE INVENTION

In the first preferred embodiment, according to the sectional view in FIG. 1, there is a rod 10 attached at one end to a base 11. Rod 10 is comprised of two parts 12 and 13 which are rigidly connected to each other. Half the length of rod 10 is a magnetostrictive material 12 and the other half is preferably a soft magnetic material 13. Material 13 has the same reluctance per unit length as magnetostrictive material 12. This is achievable when the product of permeability and cross sectional area of material 13 is equal to that of magnetostrictive material 12. A preferable condition is when material 13 has equal permeability and cross sectional area as magnetostrictive material 12. A magnet 14 with half the length of rod 10 can move along rod 10 and provide a magnetic field of constant value and length inside and along rod 10.

The magnetic circuit between magnet 14 and rod 10 is essentially closed, having only minor clearance of air gap or nonmagnetic lining to allow displacement of magnet 14 relative to rod 10 and free expansion or contraction of rod 10.

When magnet 14 is displaced along rod 10, the length of the magnetic field inside magnetostrictive material 12 changes, but the magnetic circuit remains essentially closed. At the same time, the change in the length of the magnetic field inside magnetostrictive material 12 is compensated by an equal and opposite change inside material 13, and therefore, the magnetic circuit remains undisturbed and the intensity of the magnetic field stays constant. As a result, magnetostrictive material 12 expands or contracts linearly proportional to the displacement of magnet 14. Consequently, end 15 of rod 10 is displaced relative to base 11 linearly proportional to the displacement of magnet 14. The displacement of end 15 is a small fraction of the displacement of the magnet, the fraction being the amount of strain due to the magnetic field in magnetostrictive material 12. In other words, the actuator is a noncontact leverage mechanism.

The strength of the magnetic field in magnetostrictive material 12 is essentially constant in the active part of the material, which is inside the magnetic circuit, and zero in the inactive pan, which is outside the magnetic circuit. This provides essentially hysteresis free and linear open loop performance of the device in contrast to conventional open loop magnetostrictive and electroactive actuators. Magnetic fields to saturation limit may be used to achieve strains as high as 0.002 without affecting the performance.

Since the strain in the magnetostrictive material 12 is about 0.001, a relatively large variation in the active length of magnetostrictive material 12 provides a very small displacement. For example, a 1 μm change in the length of the magnetic field in magnetostrictive material 12 is equivalent to about 1 nm displacement at end 15. Displacement of magnet 14 to 1 μm is easily achievable with ordinary micrometers, motors, or lead screws, and their stiction and backlash is reduced to undetectable values in the final expansion or contraction of the magnetostrictive material. Similarly, submicron displacements of magnet 14 provide subnanometer displacements at end 15.

In the same context, accurate measurement of the small expansion of magnetostrictive material 12 can be achieved easily with the measurement or closed loop control of the relatively large motion of magnet 14.

In conventional micro positioning systems, the sensor has to measure small displacements in the subnanometer to nanometer range. The control electronics must also deal with small signals and provide drive voltage or current variations at the same small level. The invention transfers this highly demanding task to the measurement and control of displacements of about 1000 times larger which are in the range of micron or tenths of micron. This eliminates the need for sophisticated and costly systems, and at the same time delivers higher performance.

Material 13 may be another magnetostrictive material with a magnetostriction which is opposite in direction relative to that of magnetostrictive material 12, so that upon the displacement of the magnet, an increase in the expansion of one part of rod 10 is accompanied by a decrease in the contraction of the other part, thus increasing the sensitivity and working range of the actuator.

Magnetostrictive material 12 may be kept under longitudinal compressive prestress to increase its magnetostriction and mechanical strength, and reduce its sensitivity to variations in the working load and temperature.

The actuator does not have any joint or flexure mechanism. Therefore, there is no backlash or lost motion, and the resonant frequency of the device is high. These are basic requirements for micro positioning systems.

Due to the geometry of the magnetic circuit, magnet 14 does not have any preferred position along rod 10. Therefore, the only force required to keep magnet 14 in place, or move it to another position is due to the load at end 15 and the mass of the magnet. Due to the leverage mechanism, a small force on magnet 14 can drive a large load at end 15. With a leverage factor of 1000, a force of 1 N on the magnet can hold a load of 1000 N at end 15.

Magnet 14 is displaced by a mechanical device such as a screw, a micrometer, a hydraulic or pneumatic actuator, or, by an electromagnetic device such as a linear motor, a rotary motor, or an electromagnetic actuator.

The parts have preferably circular cross sections for symmetry and a more uniform field inside the magnetostrictive material. However, they can have other geometries.

Material 13 may be a nonmagnetic material. In this case upon the displacement of magnet 14, both the length and intensity of the magnetic field inside magnetostrictive material 12 change. The actuator still performs with high resolution, but exhibits nonlinearity and hysteresis.

In General, when reluctance per unit length of material 13 is larger than that of magnetostrictive material 12, the device performs with nonlinearity and hysteresis, and is more sensitive to the displacement of magnet 14. The reason is, as magnet 14 moves toward material 13, a larger portion of the magnetomotive force is used inside material 13 to overcome the larger reluctance. This reduces the magnetic intensiy inside magnetostrictive material 12. A combined reduction in magnetic intensity and active length for magnetostrictive material 12 results in a relatively larger change in its expansion. When reluctance per unit length of material 13 is smaller than that of magnetostrictive material 12, the device performs with nonlinearity and hysteresis, and is less sensitive to the displacement of magnet 14. This is not a desirable condition.

The actuator can be constructed to function like a conventional mechanical micrometer. The parts can be installed inside an enclosure which can be fastened to a base at the front end.

Figure 2:
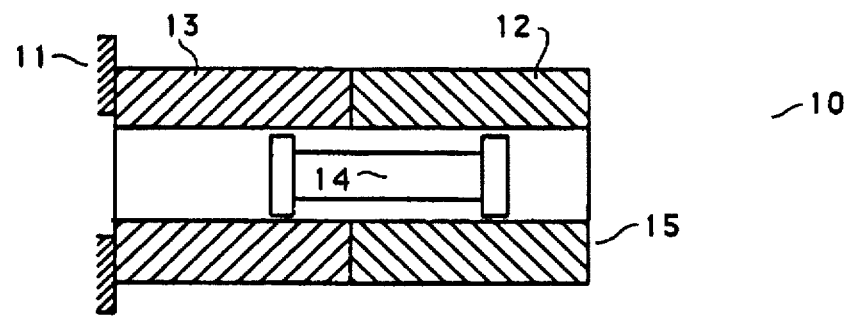

The second preferred embodiment, according to the sectional view in FIG. 2, is similar to the first preferred embodiment with the only differences that magnetostrictive material 12 and material 13 are hollow cylinders and magnet 14 is a rod disposed inside them.

Figure 3:
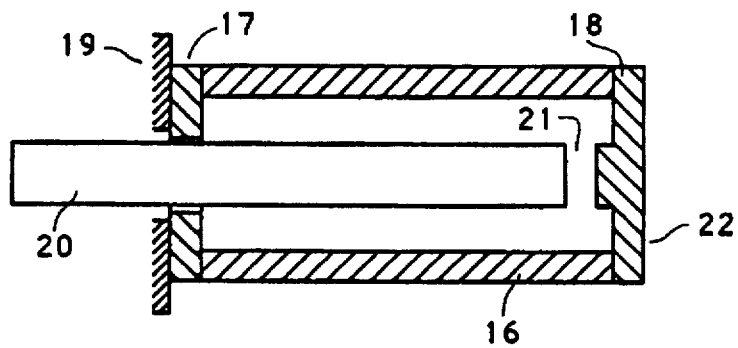

In the third preferred embodiment according to the sectional view in FIG. 3 there is a hollow cylinder 16 of magnetostrictive material closed at both ends with disks 17 and 18. Cylinder 16 is attached at one end to a base 19. Disk 17 is a magnet having radial direction of magnetism. Disk 18 is a magnetic material with high permeability. A rod 20 of soft magnetic material with high permeability can pass through a central hole in disk 17 and move along cylinder 16. Magnet 17 provides a magnetic field inside magneteto- strictive material 16 through rod 20, disk 17, and air gap 21.

when rod 20 is displaced along cylinder 16, the length of air gap 21 changes. This causes a change in the magnetic field inensity inside magnetostrictive material 16. As a result, magnetostrictive material 16 expands or contracts. Consequently, end 22 is displaced relative to base 19. This displacement is a small fraction of the displacement of rod 20. The third preferred embodiment provides small displacement, but with nonlinearity and hysteresis.

All embodiments may have a hollow cross section for applications such as straight through optical positioning.

I claim:

1. An actuator that provides small displacements for applications such as micro positioning, motion control, or measurement, by reducing a relatively larger displacement of a magnetic field inside a magnetostrictive material, said actuator including:

a first longitude of magnetostrictive material;

a second longitude of nonmagnetic or soft magnetic material, attached rigidly end to end to the first longitude to provide a combined longitude;

a magnet, such as a permanent magnet or an electromagnet, providing an essentially constant magnetomotive force, to move along and provide a magnetic field inside and along a portion of the combined longitude;

the magnetic circuit between the magnet and the combined longitude is essentially closed, having only minor clearance of air gap or nonmagnetic lining to allow displacement of the magnet relative to the combined longitude and free expansion or contraction of the magnetostrictive material, when the magnet is displaced along the combined longitude, the length of the magnetic field inside the magnetostrictive material changes, while the magnetic circuit remains essentially closed, and the change in the length of the magnetic field inside the magnetostrictive material is accompanied by an equal and opposite change in the second longitude, the change in the length or a combined change in the length and intensity of the magnetic field inside the magnetostrictive material causes a change in the expansion or contraction of the magnetostrictive material, and consequently, changes the displacement of one end of the magnetostrictive material relative to the other, the displacement from the magnetostrictive material is a fraction of the displacement of the magnet, the fraction being the mount of swain due to the magnetic field in the magnetostrictive material.

2. The actuator of claim 1 wherein the second longitude and the magnetostrictive material have essentially equal reluctance per unit length, therefore, the intensity of the magnetic field inside the magnetostrictive material is essentially constant in its active part, which is in the magnetic circuit, and zero in its inactive part, which is out of the magnetic circuit, thus, on the one hand the actuator performs without hysteresis, and on the other hand, the change in the expansion or contraction of the magnetogtrictive material is proportional to the displacement of the magnet, the proportionality constant being the amount of strain in the magnetostrictive material due to the magnetic field.

3. The actuator of claim 1 wherein the second longitude is also a magnetostrictive material with a magnetostriction which is opposite in direction relative to that of the magnetostrictive material of the first longitude, so that upon the displacement of the magnet, an increase in the expansion of one part of the combined longitude is accompanied by a decrease in the contraction of the other part, thus increasing the sensitivity and working range of the actuator.

4. The actuator of claim 1 wherein the magnetostrictive material is kept under longitudinal compressive prestress to increase its magnetostriction and mechanical strength, and reduce its sensitivity to variations in the working load and temperature.

5. The actuator of claim 1 wherein one or more parts have hollow cross section.

6. The actuator of claim 1 wherein proper pole pieces or paths of soft magnetic material are added to the magnet to close the magnetic circuit between the magnet and the combined longitude more efficiently and provide a more uniform magnetic field inside the combined longitude, thus improving the overall performance and linearity of the actuator.

7. The actuator of claim 1 having a cylindrical axis of symmetry along the combined longitude.

8. The actuator of claim 1 wherein the magnet is displaced by a mechanical or an electromechanical device.

9. An actuator that provides small displacements for applications such as micro positioning, motion control, or measurement, by reducing a relatively larger displacement through the variation of a magnetic field inside a magnetostrictive material, said actuator including:

- a magnet, such as a permanent magnet or an electromagnet, providing an essentially constant magnetomotive force;
- a longitude of magnetostrictive material;
- pieces of magnetic material to provide a magneitc circuit between the magnet and the magnetostictive material;
- the magnet or part of the magnetic circuit can move to change an air gap in the magnetic circuit, and therefore, change the intensity of the magnetic field inside the magnetosctive material,
- the change in the intensity of the magnetic field inside the magnetostrictive material causes a change in the expansion or contraction of the magnetostrictive material, and consequently, changes the displacement of one end of the magnetostrictive material relative to the other,
- the displacement from the magnetostrictive material is a fraction of the chagne in the length of the air gap, the fraction being the amount of strain due to the magnetic field in the magnetostrictive material.

10. The actuator of claim 9 wherein the magnetostrictive material is kept under longitudinal compressive prestress to increase its magnetostriction and mechanical strength, and reduce its sensitivity to variations in the working load and temperature.

11. The actuator of claim 9 wherein one or more parts have hollow cross section.

12. The actuator of claim 9 having a cylindrical axis of symmetry along the combined longitude.

13. The actuator of claim 9 wherein the moving part of the magnetic circuit is displaced by a mechanical or an electromechanical device.

* * * * *